US011726025B2

(12) United States Patent
Ruster

(10) Patent No.: US 11,726,025 B2
(45) Date of Patent: Aug. 15, 2023

(54) SYSTEM FOR ANALYZING ELECTROMAGNETIC RADIATION

(71) Applicant: Rohde & Schwarz GmbH & Co. KG, Munich (DE)

(72) Inventor: Thomas Ruster, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 642 days.

(21) Appl. No.: 16/653,423

(22) Filed: Oct. 15, 2019

(65) Prior Publication Data

US 2021/0109010 A1    Apr. 15, 2021

(51) Int. Cl.
| | |
|---|---|
| *G01N 17/00* | (2006.01) |
| *G01R 23/17* | (2006.01) |
| *G01R 31/26* | (2020.01) |
| *G01R 33/32* | (2006.01) |
| *G05F 7/00* | (2006.01) |
| *G01R 33/26* | (2006.01) |

(52) U.S. Cl.
CPC ........... *G01N 17/004* (2013.01); *G01R 23/17* (2013.01); *G01R 31/2635* (2013.01); *G01R 33/26* (2013.01); *G01R 33/32* (2013.01); *G05F 7/00* (2013.01)

(58) Field of Classification Search
CPC ...... G01N 17/004; G01R 23/17; G01R 33/26; G01R 33/32; G01R 31/2635; G05F 7/00
See application file for complete search history.

(56) References Cited

U.S. PATENT DOCUMENTS

| | | | | | |
|---|---|---|---|---|---|
| 3,197,694 | A | * | 7/1965 | Cunningham ......... | G01R 33/26 324/304 |
| 3,500,176 | A | * | 3/1970 | Jean-Claude .......... | G01R 33/26 324/304 |
| 3,513,381 | A | * | 5/1970 | William, Jr. ........... | G01R 33/26 324/304 |
| 3,873,908 | A | * | 3/1975 | Young .................... | G01R 33/26 324/304 |
| 4,024,396 | A | * | 5/1977 | Hill .......................... | G01J 3/10 505/880 |

(Continued)

FOREIGN PATENT DOCUMENTS

| | | |
|---|---|---|
| EP | 3213093 A1 | 9/2017 |
| WO | 2016066532 A1 | 3/2016 |

*Primary Examiner* — Steven L Yeninas
(74) *Attorney, Agent, or Firm* — Ditthavong, Steiner & Mlotkowski

(57) ABSTRACT

The inventive system for analyzing electromagnetic radiation comprises: an enclosure filled with gas containing atoms of a known type, at least one light source emitting light capable of exciting the atoms of the known type in the gas, a source of the electromagnetic radiation to be analyzed arranged such that the emitted electromagnetic radiation acts on the atoms of the known type in the gas, and a sensor for capturing light emitted by and/or passed through the gas. Further, the system comprises an electrical field source and/or magnetic field source configured to establish a predefined electrical field and/or magnetic field acting on the atoms of the known type in the gas. The light captured by the sensor reflects a response of the atoms of the known type in the gas on the electrical field and/or the magnetic fields, the light from the at least one light source, and the electromagnetic radiation to be analyzed.

6 Claims, 3 Drawing Sheets

(56) References Cited

U.S. PATENT DOCUMENTS

Figure 1:
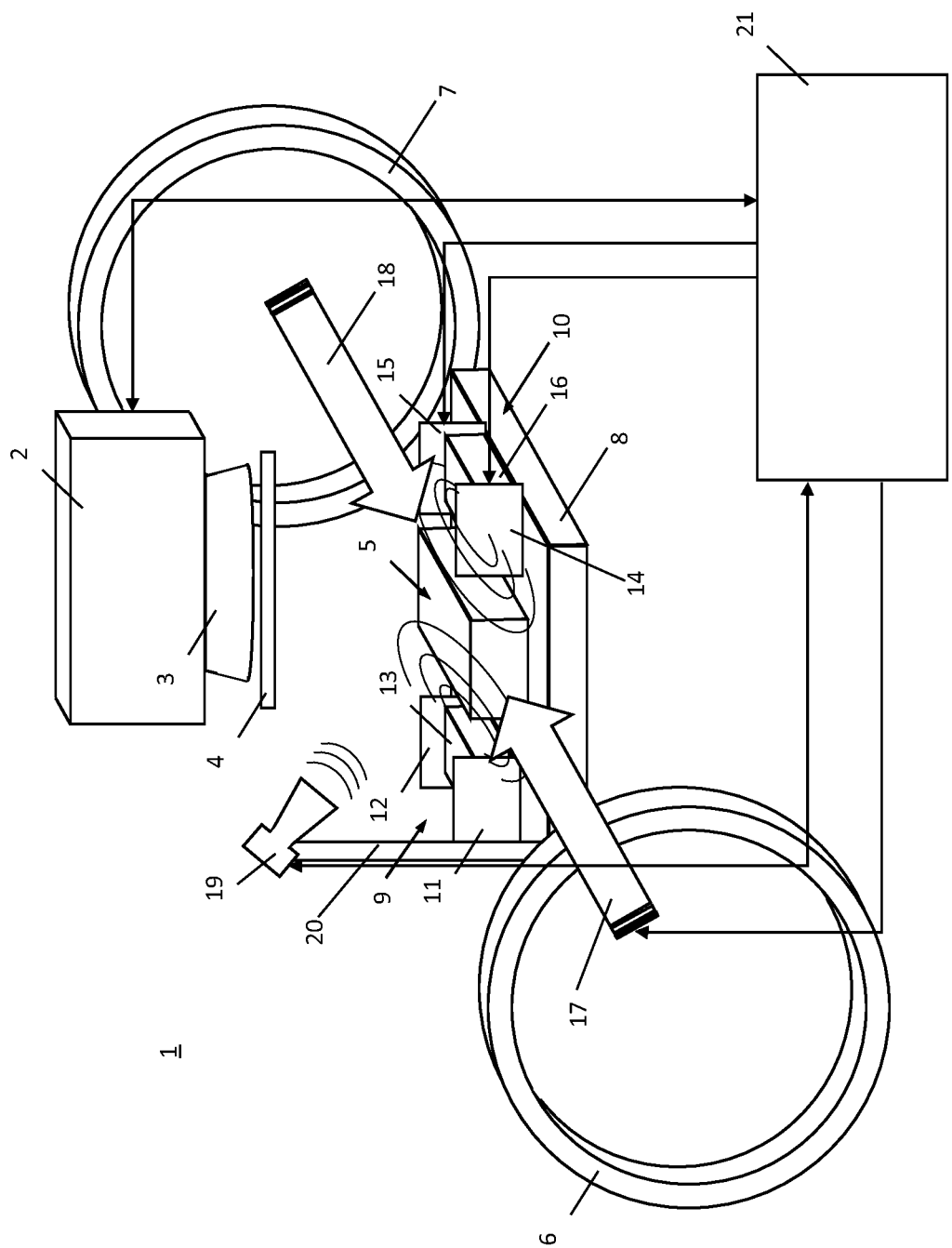

| | | | | |
|---|---|---|---|---|
| 4,293,769 | A * | 10/1981 | Kleppner | G01J 1/00 |
| | | | | 250/423 P |
| 10,509,065 | B1 * | 12/2019 | Shaffer | G01R 29/0885 |
| 2007/0170933 | A1 * | 7/2007 | Ma | G01N 21/66 |
| | | | | 324/754.03 |
| 2013/0033261 | A1 * | 2/2013 | Walker | G01R 33/26 |
| | | | | 324/318 |
| 2016/0116553 | A1 * | 4/2016 | Kim | G01R 33/032 |
| | | | | 324/304 |
| 2016/0313418 | A1 * | 10/2016 | Fujii | G01R 33/0052 |
| 2016/0363617 | A1 * | 12/2016 | Anderson | G01R 29/0885 |
| 2017/0023654 | A1 * | 1/2017 | Kobayashi | G01R 33/26 |
| 2018/0143265 | A1 * | 5/2018 | Nagasaka | G01R 33/34 |
| 2019/0293736 | A1 * | 9/2019 | Bulatowicz | G01C 19/62 |

* cited by examiner

SYSTEM FOR ANALYZING ELECTROMAGNETIC RADIATION

The invention regards a system for analyzing electromagnetic radiation.

In recent years, standards for measuring field quantities have continuously increased. In order to comply with increasing requirements, particularly regarding response times and bandwidth, new systems for analyzing electromagnetic radiation have been developed. The latest developments even exploit physical effects that have not been in considered in the past. One example is a sensor including a diamond that is exposed to radiation that is to be analyzed. The measurement system exploits that the diamond responds to the incoming radiation by changing its physical properties. This change in physical properties then can be analyzed for concluding on characteristics of the electromagnetic radiation to be analyzed. Such a system is described in EP 3213093 A1.

Another approach does not use a solid material in the sensor but a gas, which is also subject to radiation to be analyzed. The gas includes Rydberg atoms that are brought into an excitation level, and starting from that excitation level, microwave radiation of the signal to be analyzed results in a change in the energy levels of the outermost electron. Such a change in the energy levels can be detected using optical systems as the transitions between different energy levels lead to emission of light or the excitation itself leads to a change in transparency for light that is used for exciting the Rydberg atom.

A corresponding sensor is described in US 2016/0363617 A1. The measurement system comprises a cell that is filled with a gas containing Rydberg atoms. The Rydberg atoms are excited by using a first laser and additionally a coupling laser. The gas in the cell further interacts with microwave radiation, and the response of the gas in the cell can be analyzed by determining a change in the transmission of the exciting laser intensity. This effect is known as "electromagnetically induced transparency". The analysis is done by comparing the captured spectrum with predetermined spectra calculated for the Rydberg atoms in the gas. One problem of the known system is that the number of potential energy levels is limited and, thus, bandwidth and resolution of the system are also limited.

Thus, there is a need to improve the versatility of the known system for analyzing electromagnetic radiation and to improve applicability by increasing the bandwidth for measurements.

Such an improvement is achieved by the system for analyzing electromagnetic radiation according to the independent claim. The inventive system for analyzing electromagnetic radiation, comprises an enclosure filled with gas containing atoms of a known type and at least one light source emitting light capable of exciting the atoms of the known type in the gas. Generally, every gas containing Rydberg atoms may be in used for the inventive system. However, it has been proven to be most advantageous to use Caesium atoms as active atoms in the enclosure. The preferred light source for exciting the gas atoms is a laser. The wavelength of the laser is adjusted to the Rydberg atoms contained in the gas such that the outer electron of the atom can be shifted from its ground state to a suitable excitation level.

Further, the system comprises a source of the electromagnetic radiation to be analyzed arranged such that the emitted electromagnetic radiation acts on the atoms, or at least a part of it, of the known type in the gas. One preferred example for a source of the electromagnetic radiation is a horn antenna that is arranged such that the focus of the emitted radiation is inside the enclosure. The analysis of the response of the enclosed gas containing the active atoms is based on an output of a sensor capturing the light emitted by and/or passed through the gas in the enclosure. The reaction of the excited gas atoms on the incident electromagnetic radiation results in a change of physical properties and can be detected by imaging and/or measuring the intensity of fluorescence and or transmission of the light from the at least one light source.

According to the invention, the system further comprises an electrical field source and/or a magnetic field source configured to establish a predefined electrical field and/or magnetic fields, respectively, acting additionally on the atoms of the known type contained in the gas, such that the emitted or transmitted light captured by the sensor reflects a response of the atoms of the known type in the gas on the electrical field and/or the magnetic field, the light from the at least one light source, and the electromagnetic radiation to be analyzed. The addition of the electrical field and/or the magnetic field acting on the atoms in the gas exploits the Stark effect. Due to the Stark effect, the energy levels of the atoms are shifted and expanded so that transitions between new and additional energy levels can be exploited for interacting with the incident electromagnetic radiation. Thus, gaps that would exist without application of an additional electrical field between energy levels of the shells can be filled. The increasing shift and expansion of the respective energy levels for a specific type of Rydberg items can be seen in the corresponding Stark map that shows the increasing shift and expansion of the energy levels relative to the applied electrical field. It is to be noted that the magnitude of the Stark effect depends on the existence and strength of a magnetic field and its relative orientation to the applied electrical field.

Preferred embodiments are defined in the dependent claims.

According to one preferred embodiment, the gas in the enclosure is a mixture the atoms of the known type and at least one additional type of atoms or molecules. The addition of another type of atoms which is in particular not excited by the incident light allows to control the distance an atom in the Rydberg state may travel within the enclosure. Depending on the used sensor, the location of light emission by the atom is important for defining the bandwidth. An increase of the partial pressure of the additional gas increases the resolution. Contrary, a reduction of the partial pressure may be used in order to increase peak width in an imaged emission spectrum, thereby helping to improve bandwidth.

According to another preferred embodiment, the system comprises a controller configured to control the source of the electromagnetic radiation, the electrical field source and/or the magnetic field source, and the sensor such that the sensor captures the light emitted by and/or passed through the gas while the electrical field and/or the magnetic field, and the electromagnetic radiation are applied to the gas. Particularly, when the electrical field and/or the magnetic fields is/are controlled to be inhomogeneous, a broadband measurement may be performed. The electrical field and/or the magnetic field are considered to be inhomogeneous when different areas of the gas in the enclosure have different values of the electrical field strength and/or the magnetic field strength. Thus, the electrical field and/or the magnetic field are static fields which vary along the enclosed gas volume and the sensor may then produce an image spatially resolved so that different parts of the image correspond to areas within the enclosed gas volume that are subjected to different electrical field strength. Additionally or alternatively, the controller may time variably change the electrical field. Controlling the electrical field and the time variable manner allows to sweep through frequency bands. Thus, the controller may be configured to adjust the strength of the electrical field spatially and/or timely.

The system may further comprise a spectrum analysis module configured to calculate a spectrum of the incident electromagnetic radiation on the basis of the sensor output.

Depending on the sensor that is used for detecting the response of the gas to the incident electromagnetic radiation, different processing is applied. In case that the sensor is a camera, which is one preferred embodiment, the sensor produces an at least two dimensional image of light emitted by the active atoms and/or passed through the gas. Using such a camera has the advantage that a spatial resolution can be used in order to simultaneously detect and capture emission from the enclosed gas exposed to different electrical field strengths. Thus, the measurement can be conducted without any sweep blindness. The analysis of the image in the spectrum analysis module is then based on information on the spatial distribution of the electrical field strength.

According to another preferred embodiment, the sensor is a photo diode. Using such a photo diode leads to reduced costs compared to a camera. Since the photo diode integrally detects emission and/or transmission of light without any spatial resolution, at least the electrical field is controlled to vary with time and the photodiode signal is sampled accordingly. Thus, association of the measured light intensity with a corresponding electrical field strength is maintained.

Figure 2:
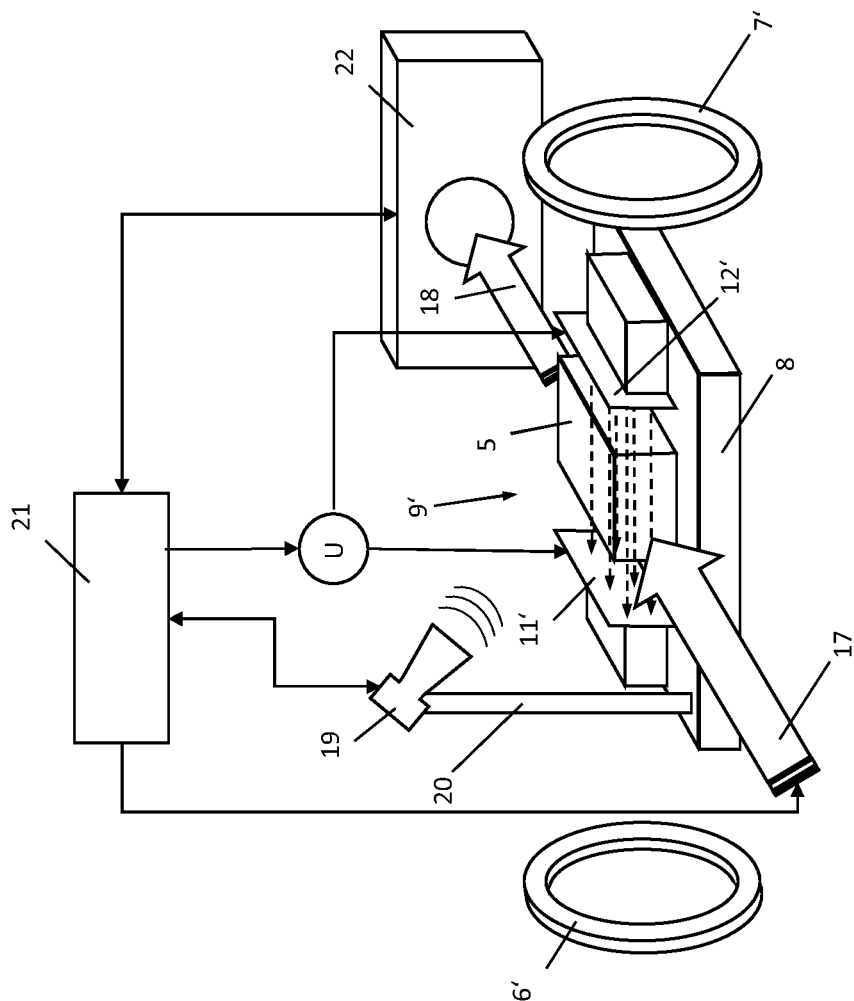
Figure 3:
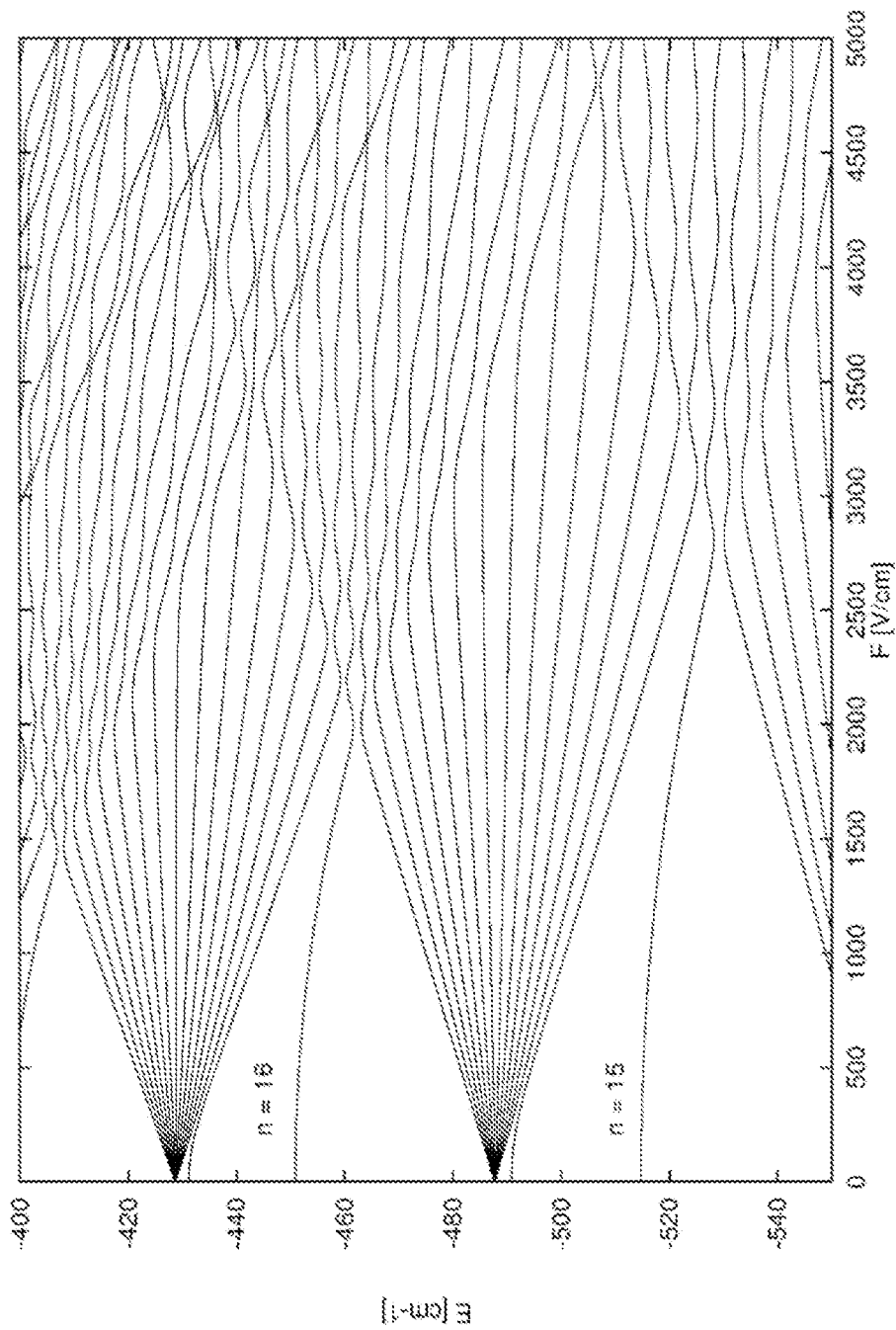

Advantages and further aspects of the invention will now be explained with reference to the annexed drawings, in which FIG. 1 first schematic for a system using a camera as sensor, FIG. 2 a second schematic for a system using a photo diode as a sensor, and FIG. 3 shows an exemplary Stark map for explaining the change of energy levels when an electrical field is applied.

FIG. 1 shows a schematic of the inventive system for analyzing electromagnetic radiation. The system 1 comprises a camera 2 equipped with a lens system 3 for capturing fluorescent light that is emitted by a gas provided in a hermetically sealed enclosure 5. The light that is emitted by the gas atoms contained in the gas inside the enclosure 5 may be filtered by a filter 4 that is adjusted to let the fluorescent light pass. The enclosure 5 is arranged between a pair of permanent magnet rings 6 and 7 as magnetic field source. It is to be noted that any type of magnetic field source, specifically coils, may be used. In case of using coils it is possible to control the strength of the field by its driver. The enclosure 5 is placed on a base plate 8, which in the simplest case may be provided for supporting reasons only. However, according to a preferred embodiment, the base plate 8 may be heated such that the enclosure 5 and, thus, the gas contained in it can be maintained at a desired and preferably constant temperature, which is for example 60° C. in case that the gas contains Caesium atoms as the responsive atoms for conducting the measurement. At 60° C., the Caesium atoms are in the gas phase.

The system 1 comprises a source for an electrical field, which is in the illustrated embodiment a pair of capacitors 9, 10 arranged at opposite sides of the enclosure 5. The capacitors 9, 10 each comprise a pair of electrodes 11, 12 and 14, 15 respectively, with a dielectric material 13 and 16 placed between them. The capacitors 9, 10 generate an electrical field which is static but inhomogeneous in the area of the enclosure 5. Towards the symmetry axis, the strength of the electrical field increases.

It is to be noted that the pair of magnetic rings 6, 7 defines an axis for the quantization states and the relative direction of the electrical field influences the Stark shift. In the illustrated embodiment, which is a preferred arrangement, the direction of the magnetic field and the electrical field are substantially parallel.

The gas atoms in the enclosure 5 are so called Rydberg atoms that are excited by a plurality of laser beams, indicated with reference numeral 17 and 18 in the drawing. The lasers are operated for example at a wave length of approximately 850 nm, 852 nm and 1470 nm in case of using three lasers as light sources in order to excite the outer electrons of the gas atoms of the active gas portion in the enclosure 5 into the Rydberg state.

The electromagnetic radiation to be measured is emitted by an antenna 19, which preferably is a horn antenna so that the radiation can be focused inside the enclosure 5. In order to avoid any relative displacement of the antenna 19 with respect to the enclosure 5, a post 20 is provided on the base plate 8 supporting the antenna 19.

For improving the dynamic range, a decreasing intensity of the electromagnetic radiation towards the outer surface of the enclosure 5 is desired and the capacitors 9 and 10 are controlled accordingly.

In order to analyze the electromagnetic radiation emitted by the antenna 19, the camera 2 captures the fluorescent light emitted by the gas atoms, in the preferred embodiment Caesium atoms. Since the electrical field generated by the capacitors 9 and 10 varies with the location inside the enclosure 5, the resonance frequency for the electromagnetic radiation depends on the location. Since the camera 2 generates an image that is two-dimensional, the intensity of the fluorescent light is captured with a spacial resolution. Thus, one dimension of the two-dimensional image reflects the frequency information whereas the other dimension shows a gradient of intensity for improving the dynamic range. For the arrangement shown in FIG. 1 it is preferred that source of the electromagnetic radiation, the electrical field source and the camera 2 are controlled simultaneously, i.e. an image is captured while the electrical field is applied to the gas in the enclosure 5 and while the electromagnetic radiation to be measured also acts on the gas atoms.

It is to be noted, that according to the preferred way of carrying out the invention, the fluorescent light emitted by the Caesium atoms is captured. It is also possible to capture laser light that is transmitted through the gas in the enclosure 5. The controller 21 controls the camera 2, the laser sources 17 and 18, emission of the radiation to be analyzed and further adjusts the strength of the electrical field by controlling the capacitors 9 and 10. In particular, a change of the electrical field strength and operation of the microwave emitter, namely the antenna 19, is controlled by the controller 21. Such a switching of the electrical field and the microwave emission by the antenna 19 is necessary when a narrowband laser is used and no or at least little additional gas is contained in the enclosure 5. Switching of the electrical field and of the electromagnetic radiation is necessary since otherwise a narrowband laser and the gas in the enclosure 5 would no longer be resonant due to the Stark shift.

Alternatively, using a broadband laser as a light source (e.g. more than 30 GHz) would render the switching of the electrical field unnecessary. The same effect may be achieved by increasing the amount of additional gas atoms in the enclosure 5. Thus, by adjusting the amount of "active" gas atoms (Rydberg atoms) and additional gas atoms of a different type (filler gas), the desired line broadening can be set. It is preferred to use an increased amount of filler gas because the filler gas at the same time is used to prevent undesired movements of the active gas atoms during measurement.

FIG. 2 shows an alternative arrangement. The main difference is that instead of the camera 2 a photo sensor 22 including at least one photodiode is used. It is evident that in such a case no spatially resolved measurement of fluorescent light emission is possible. Contrary to the embodiment as explained with reference to FIG. 1, the frequency of the laser is swept together with the strength of the electrical field. Thus, since different electrical field strengths are realized by sweeping the electrical field strength, it is not necessary to generate an inhomogeneous electrical field. As it can be seen in the drawing, only one capacitor 9' is used with the electrodes 11' and 12' arranged on opposite sides of the enclosure 5. The direction of the incident laser light and the electrical field is perpendicular to each other.

Similar to the first embodiment, again, magnetic rings 6 and 7 are provided. The magnetic field and the electrical field are aligned to each other. The arrangement as shown in FIG. 2 is suitable for capturing fluorescent light in a similar way as the embodiment of FIG. 1 but also the absorption of the incident excitation light may be measured.

As already explained with reference to FIG. 1, the condenser 9' and the light source are controlled by the controller 21.

For analyzing the electromagnetic radiation, it is exploited that the active gas atoms are brought in a Rydberg state by the incident light. In order to increase bandwidth for the measurement the invention applies an electrical field, which leads to a shift and expansion of the energy levels of the Rydberg atoms. This is shown in FIG. 3. It can be seen that relatively weak electrical field strengths are necessary to significantly vary the energy levels of the gas atoms in the illustrated example Caesium atoms. The effect that is shown in FIG. 3 is called Stark shift and significantly increases the bandwidths for energy level transitions and thus for the measurement of electromagnetic radiation.

The invention claimed is:

1. A system for analyzing electromagnetic radiation, comprising:
   an enclosure filled with gas containing atoms of a known type;
   at least one light source emitting light capable of exciting the atoms of the known type in the gas;
   a source of the electromagnetic radiation to be analyzed arranged such that the emitted electromagnetic radiation acts on the atoms of the known type in the gas; and
   a sensor for capturing an intensity of transmission of the light emitted by and/or from the at least one light source passed through the gas,
   wherein the system further comprises an electrical field source and/or magnetic field source configured to establish a predefined electrical field and/or magnetic field acting on the atoms of the known type in the gas, such that the light captured by the sensor reflects a response of the atoms of the known type in the gas on the electrical and/or magnetic field, the light from the at least one light source and the electromagnetic radiation to be analyzed,
   wherein the sensor is a two-dimensional imaging device producing an at least two-dimensional image of the light emitted by and/or from the at least one light source passed through the gas,
   wherein the two-dimensional image reflects frequency information and a gradient of intensity for improving a dynamic range.

2. The system according to claim 1, wherein the gas is a mixture of the atoms of the known type and at least one additional type of atoms or molecules.

3. The system according claim 1, wherein the system comprises a controller configured to control the source of the electromagnetic radiation, the electrical field source and/or the magnetic field source, and the sensor such that the sensor captures the light emitted by and/or passed through the gas while the electrical field and/or the magnetic field, and the electromagnetic radiation are applied to the gas.

4. The system according to claim 3, wherein the controller is configured to adjust the strength of the electrical field.

5. The system according to claim 1, wherein the electrical field source and/or the magnetic field source are configured or controlled such that the respective field has varying field strength in the enclosed gas volume.

6. The system according to claim 1, wherein the system comprises a spectrum analysis module configured to calculate a spectrum of the electromagnetic radiation on the basis of the sensor output.

* * * * *